(12) United States Patent
Cook et al.

(10) Patent No.: US 10,892,209 B2
(45) Date of Patent: Jan. 12, 2021

(54) SEMICONDUCTOR DEVICE WITH METAL DIE ATTACH TO SUBSTRATE WITH MULTI-SIZE CAVITY

(71) Applicant: Texas Instruments Incorporated, Dallas, TX (US)

(72) Inventors: Benjamin Stassen Cook, Addison, TX (US); Nazila Dadvand, Richardson, TX (US); Sreenivasan Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/363,468

(22) Filed: Mar. 25, 2019

(65) Prior Publication Data

US 2020/0312747 A1 Oct. 1, 2020

(51) Int. Cl.
*H01L 23/495* (2006.01)
*H01L 21/48* (2006.01)

(52) U.S. Cl.
CPC .... *H01L 23/49513* (2013.01); *H01L 21/4871* (2013.01); *H01L 23/49503* (2013.01); *H01L 23/49548* (2013.01); *H01L 23/49568* (2013.01); *H01L 23/49582* (2013.01); *H01L 2224/32245* (2013.01)

(58) Field of Classification Search
CPC ......... H01L 23/49513; H01L 23/49582; H01L 23/49503; H01L 23/49548; H01L 23/49568; H01L 23/495–4596; H01L 2224/291–29184; H01L 2224/32245; H01L 23/142; H01L 33/62
See application file for complete search history.

(56) References Cited

U.S. PATENT DOCUMENTS

| | | | | |
|---|---|---|---|---|
| 5,298,768 A | * | 3/1994 | Okazaki | H01L 33/486 257/100 |
| 6,593,643 B1 | * | 7/2003 | Seki | H01L 23/49582 257/677 |
| 2003/0143776 A1 | * | 7/2003 | Pedron, Jr. | H01L 21/6835 438/106 |
| 2008/0061411 A1 | * | 3/2008 | Shen | H01L 23/49531 257/670 |
| 2011/0227233 A1 | | 9/2011 | Wainerdi et al. | |
| 2013/0313726 A1 | | 11/2013 | Uehling | |
| 2016/0172281 A1 | * | 6/2016 | Tsai | H01L 23/49562 257/675 |
| 2017/0178998 A1 | | 6/2017 | Jeun et al. | |
| 2017/0287816 A1 | * | 10/2017 | Vreman | H01L 23/49513 |
| 2018/0068934 A1 | * | 3/2018 | Cho | H01L 23/49548 |

* cited by examiner

*Primary Examiner* — Kevin Parendo
(74) *Attorney, Agent, or Firm* — Ronald O. Neerings; Charles A. Brill; Frank D. Cimino

(57) ABSTRACT

A semiconductor device includes a metal substrate including a through-hole aperture having a multi-size cavity including a larger area first cavity portion above a smaller area second cavity portion that defines a first ring around the second cavity portion, where the first cavity portion is sized with area dimensions to receive a semiconductor die having a top side with circuitry coupled to bond pads thereon and a back side with a metal (BSM) layer thereon. The semiconductor die is mounted top side up with the BSM layer on the first ring. A metal die attach layer directly contacts the BSM layer, sidewalls of the bottom cavity portion, and a bottom side of the metal substrate.

24 Claims, 4 Drawing Sheets

SEMICONDUCTOR DEVICE WITH METAL DIE ATTACH TO SUBSTRATE WITH MULTI-SIZE CAVITY

CROSS-REFERENCE TO COPENDING APPLICATIONS

This application has subject matter related to copending application Ser. No. 16/026,371 entitled "SEMICONDUCTOR DEVICE WITH ELECTROPLATED DIE ATTACH" that was filed on Jul. 3, 2018.

FIELD

This Disclosure relates to semiconductor device assembly, more specifically to die attachment to a substrate.

BACKGROUND

Packaged semiconductor devices generally comprise an integrated circuit (IC) die which is conventionally a silicon die that is mounted on a die pad of a workpiece such as a lead frame using a die attach adhesive. Other workpieces include an interposer, printed circuit board (PCB), and another IC die. For IC die assembled top (active) side up and back side down, the die attach adhesive provides a mechanical attachment, and generally also provides an electrical and/or thermal pathway to from the IC die to the die pad. The die attach adhesive generally comprises a polymer such as a polyimide or an epoxy-based adhesive. Silver is often added in particle flake form as a filler to the polymer to raise both the electrical conductivity and the thermal conductivity.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional die attach solutions comprising metal particle filled polymers have significant thermal and electrical resistance. Since thermal management is becoming more important with the trend for more compact and more highly integrated electronic systems having smaller features and running at higher operating currents, higher thermal conductivity die attach arrangements are needed that also provide a low electrical resistance when back side electrical contact to the semiconductor die is used. It is recognized that although solder die attach, such as eutectic gold and tin (AuSn), can provide back side electrical contact to the semiconductor die with relatively good thermal and electrical resistance performance as compared to metal particle filled polymers, solder die attach is relatively expensive, and is limited to solderable die surfaces. Moreover, the solder die attach process generally involves an inert reflow process at temperatures that can cause temperature-induced stresses to the semiconductor die's metal interconnect.

Disclosed aspects include a semiconductor device on a metal substrate that includes a through-hole aperture including a multi-size cavity and a semiconductor die having a top side with circuitry coupled to bond pads and a back side with a back side metal (BSM) layer thereon that is directly attached onto the metal substrate by an electroplated (plated) metal die attach layer. Disclosed semiconductor devices thus solve voiding issues related to Sn-copper (Cu) intermetallic formation in the case of solder die attach, and the thermal conductivity to the metal substrate can generally be increased by one to two orders of magnitude over conventional conductive die attach (Ag particle filled epoxy). Also, disclosed multi-size cavities improve the mechanical stability of the semiconductor device due to the metal die attach layer being in the transition region between the respective cavity portions.

Disclosed aspects include a semiconductor device that includes a metal substrate including a through-hole aperture having a multi-size cavity including a larger area first cavity portion (referred to herein as a 'top cavity portion') above a smaller area second cavity portion (referred to herein as a 'bottom cavity portion') that defines a first ring around the second cavity portion. The top cavity portion is sized with area dimensions to receive a semiconductor die having a top side with circuitry coupled to bond pads, and a back side with a BSM layer thereon. The semiconductor die is mounted top side up with the BSM layer on the first ring. A metal die attach layer directly contacts the BSM layer, sidewalls of the bottom cavity portion, and a bottom side of the metal substrate.

BRIEF DESCRIPTION OF THE DRAWINGS

Reference will now be made to the accompanying drawings, which are not necessarily drawn to scale, wherein.

DETAILED DESCRIPTION

Figure 1A:
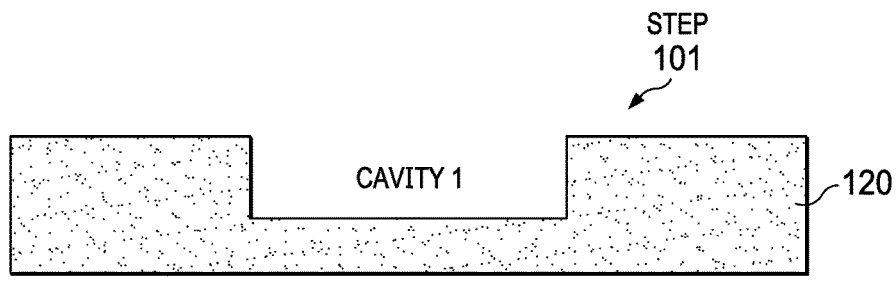
FIG 1A-F show successive cross-sectional depictions for an example assembly method for forming a disclosed semiconductor device on a metal substrate including a through-hole aperture having a multi-size cavity that provides a first ring, where the semiconductor die having a BSM layer is on the first ring, and the BSM layer is directly attached to the metal substrate by a plated metal die attach layer, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIGS. 1A-F show successive cross-sectional depictions for an example assembly method for forming a disclosed semiconductor device on a metal substrate 120 including a through-hole aperture 121 having a multi-size cavity that provides at least a first ring 118, where the semiconductor die 180 has a BSM layer 186 that is on the first ring 118, and the BSM layer 186 is directly attached to the metal substrate 120 by a plated metal die attach layer 187. As used herein, a 'ring' means an enclosed shape such as being substantially circular such as elliptical, rectangular, or square.

The metal die attach layer 187 generally consists of a single layer. The multi-size cavity includes a top cavity portion shown as cavity 1 on top of the bottom cavity portion shown as cavity 2 that defines the first ring 118 which is around the bottom cavity portion. The BSM layer 186 is directly attached onto the first ring 118 by the plated metal die attach layer 187. The metal substrate 120 generally comprises Cu or a Cu alloy and may be 150 µm to 350 µm thick.

Step 101 comprises providing at least one metal substrate 120 including a larger area top cavity portion that is sized with area dimensions to receive a semiconductor die 180 with the metal substrate having the top cavity portion shown as cavity 1 in FIG. 1A. The metal substrate 120 is generally part of a leadframe panel or leadframe sheet comprising a plurality of repeating metal substrates 120. The top cavity portion can comprise a partially etched region, such as being half-etched. Although not shown, lateral to the top cavity portion there can be metal pads (e.g. Cu, Ni, etc.) pads on dielectric polymer pads on the metal substrate 120 with thereon (see FIG. 4 described below). In this arrangement the polymer pads 125a electrically isolate the metal pads 125b (both shown in FIG. 4) from each other.

Figure 1B:
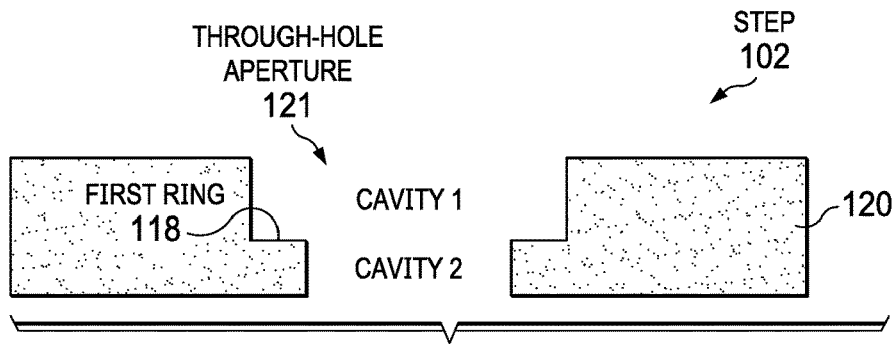

Step 102 comprises forming a through-hole aperture 121 including a multi-size cavity by removing metal from a portion of an area of the top cavity portion of the metal substrate 120 to form a smaller area second cavity portion shown as cavity 2 in FIG. 1B that defines a first ring 118 around the bottom cavity portion. The bottom cavity portion extends to a bottom of the metal substrate 120. The metal removing can comprise a masked back side etch.

Figure 1C:
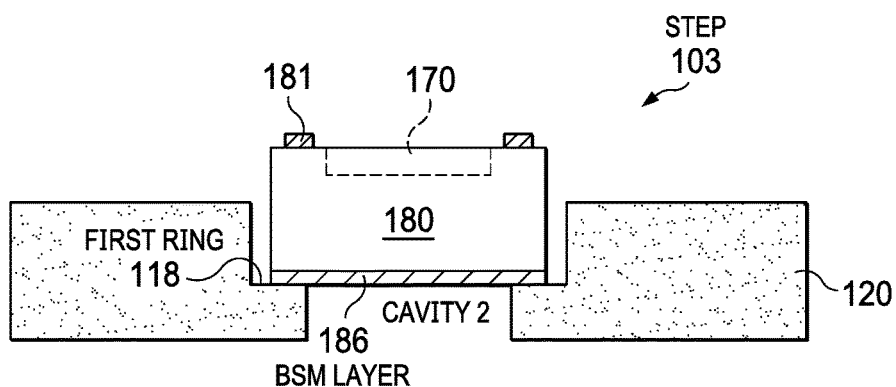

Step 103 comprises inserting (e.g., picking and placing) a semiconductor die 180 top (active) side up with the BSM layer 186 on the first ring 118 to be within the top cavity portion with the result shown in FIG. 1C showing a portion of the semiconductor die 180 extending above the top of the metal substrate 120. The top side of the semiconductor die 180 includes circuitry 170 with nodes coupled to bond pads 181 and a back side with a BSM layer 186 thereon. The circuitry 170 comprises circuit elements (including transistors, and generally diodes, resistors, capacitors, etc.) formed in a semiconductor layer (an epitaxial layer on a bulk substrate) configured together for generally realizing at least circuit function. Example circuit functions include analog (e.g., amplifier or power converter), radio frequency (RF), digital, or non-volatile memory functions. Although not shown, under the BSM layer 186, there may be a refractory metal barrier layer (e.g., TiW). The bond pads 181 can include thereon Cu pillars or solder bumps.

Figure 1D:
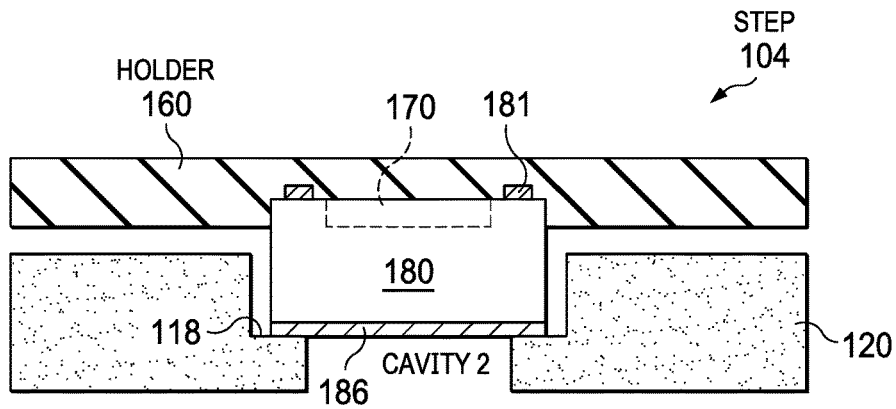
Figure 1E:
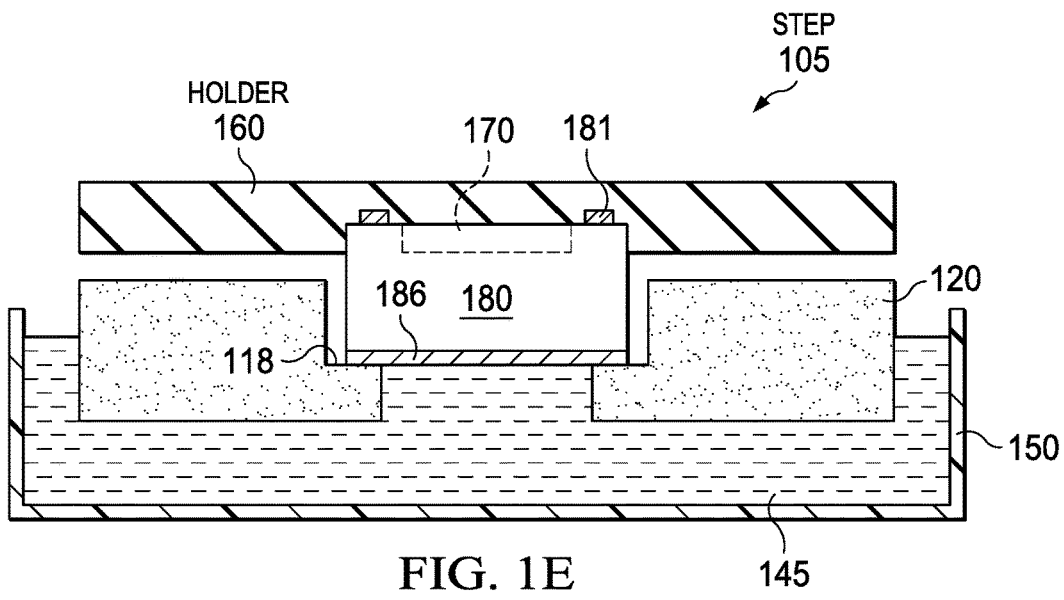

In step 104, before plating the metal die attach layer 187 on the BSM layer 186 on the back side of the semiconductor die 180, the top side can be covered or otherwise held in order to prevent the semiconductor die 180 from falling off when inside the plating solution with the result shown in FIG. 1D in the case of a holder 160 (e.g., a dielectric cover 130 with recesses for receiving the semiconductor die 180). Alternatively, entirely or in part a plating solution resistant tape, such as to seal the plating solution out, can be used. Step 105 comprises immersing at least the BSM layer 186 of the semiconductor die 180 and a bottom side of the metal substrate 120 into a plating container 150 that provides an electroplating bath including a plating solution 145 with the plating process apparatus shown in FIG. 1E without the electrical connections and anode that will be present during plating.

Figure 1F:
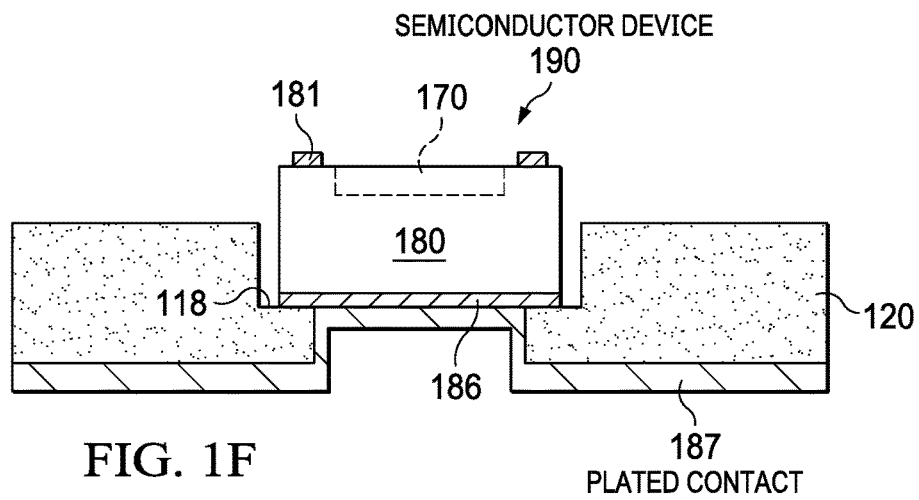

The BSM layer 186 on the back side of the semiconductor die 180 bonds the semiconductor die 180 to the metal substrate 120 as a result of the plated metal die attach layer 187 deposited by the electroplating process. The metal die attach layer 187 can comprise Cu or another electrically conductive material such as nickel, or cobalt, or alloys thereof. FIG. 1F shows the results of the plating comprising forming a metal die attach layer 187 that directly contacts the BSM layer 186, the sidewalls of the bottom cavity portion, and a bottom side of the metal substrate 120.

The plating solution 145 includes an electrolyte containing one or more dissolved metal salts including the metal (e.g., Cu) of interest to electroplate as well as other ions that permit the flow of electricity. There is also generally a sealant as note above, such as electroplating solution resistant tape, between the holder 160 and the metal substrate 120 to avoid plating metal on the top side of the semiconductor die 180. For electroplating, the metal substrate 120 is connected to a negative terminal (cathode) of a power supply, and an electrically conductive structure spaced aperture from the metal substrate 120 such as a metal block functions as an anode which is positioned apart from the metal substrate 120 that is connected to a positive terminal (anode) of the power supply.

The electroplating is generally performed at a temperature from 15° C. to 30° C. to avoid introduction of temperature induced stresses, such as to the semiconductor die's 180 interconnect. At the cathode, the dissolved metal ions (e.g., $Cu^{+2}$) in the electrolyte solution are reduced at the interface between the solution and the cathode, such that they plate out to a zero valence state metal (e.g., Cu metal) as the metal die attach layer 187 onto the cathode. The electroplating is generally performed using direct current (DC) but can also be performed as pulsed electroplating.

Shown in FIG. 1F is a semiconductor device 190 including the metal die attach layer 187 that fills a portion of the volume under the BSM layer 186 on the bottom side of the semiconductor die 180 within the bottom cavity portion and the walls of the bottom cavity portion to provide a die attachment, as well as on the bottom side of the metal substrate 120. This result is shown after removing the holder 160 or tape. The time for the electroplating process can be calculated by dividing the desired metal die attach layer 187 thickness by the deposition rate. The metal die attach layer 187 thickness can be designed to be similar to the metal substrate 120 which may be about 200 µm, such as being 40 to 250 μm thick, for example 50 to 100 μm thick. Although the BSM layer 186 is shown in FIG. IF having a uniform thickness, its thickness can be a uniform or non-uniform depending on the particular plating chemistry used.

Figure 1G:
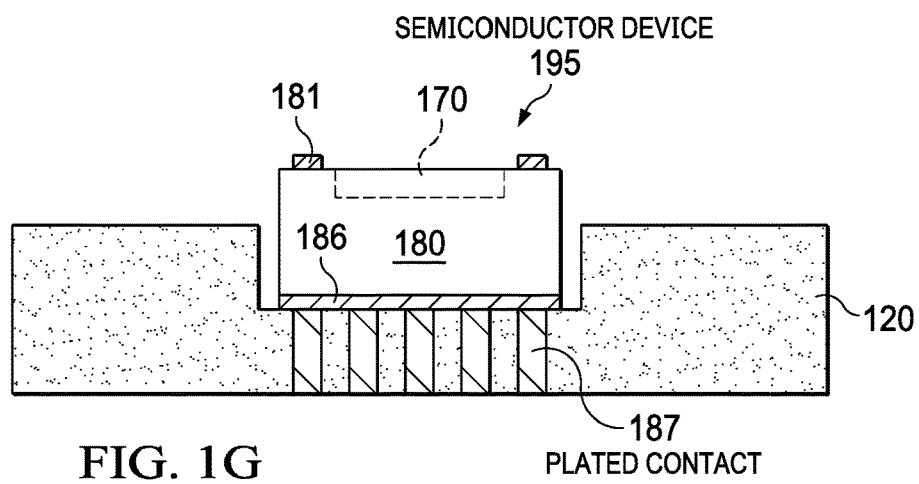
FIG. 1G shows a cross-sectional depiction of a semiconductor device related to the semiconductor device shown FIG. 1F, except now there are multiple smaller cavity 2's in the metal substrate filled with a disclosed metal die attach layer rather than a single larger cavity 2 filled with a disclosed metal die attach layer.

FIG. 1G shows a cross-sectional depiction of a semiconductor device 195 related to the semiconductor device 190 shown FIG. 1F. The through-hole aperture in this arrangement comprises a plurality of the through-hole apertures comprising apertures in the metal substrate 120 filled with the metal die attach layer 187 each extending from the BSM layer 186 to the bottom side of the metal substrate 120. There are thus multiple smaller cavity 2's in the metal substrate 120 filled with a disclosed metal die attach layer 187, rather than a single larger cavity 2 shown in FIG. 1F filled with a disclosed metal die attach layer. In addition, the bottom side of the metal substrate 120 is optionally shown lacking the metal die attach layer 187 thereon.

Figure 2A:
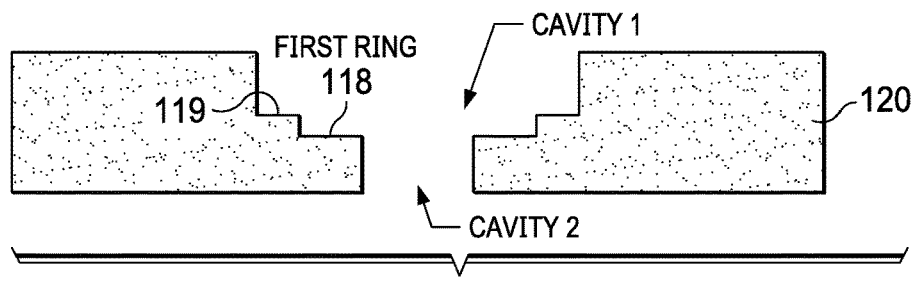
FIGS. 2A-C show successive cross-sectional depictions for an example method for forming a disclosed semiconductor device on a metal substrate including a through-hole aperture having multi-size cavity that provides a first ring and an additional second ring (or a 'pedestal') above the first ring, where the semiconductor die having a BSM layer that is on the second ring and is directly attached to the metal substrate by a plated metal die attach layer, according to an example aspect.
Figure 2B:
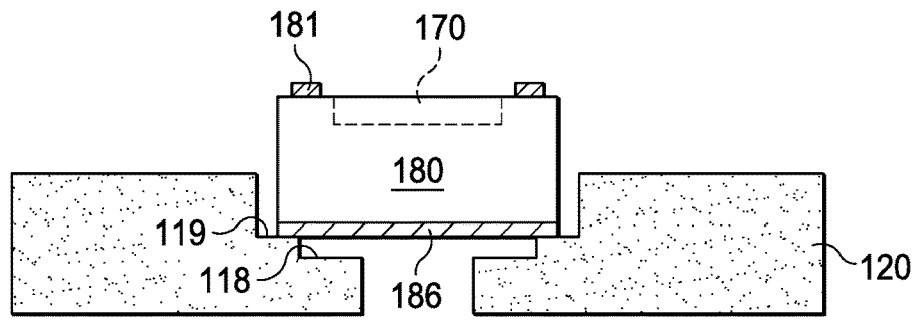
Figure 2C:
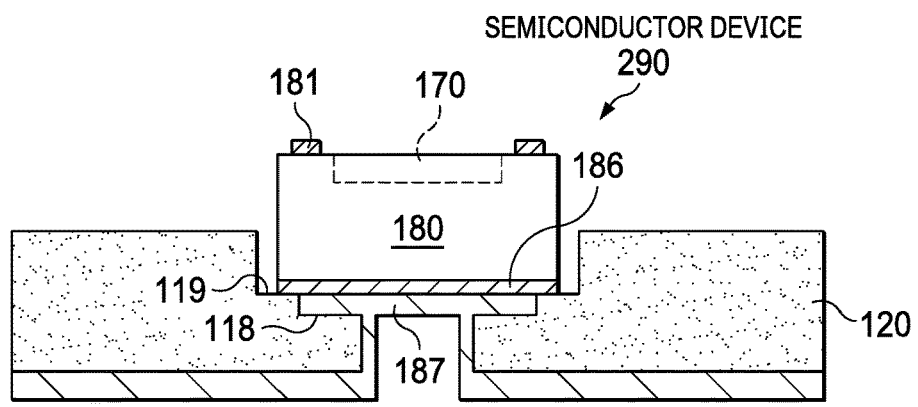

FIGS. 2A-C show successive cross-sectional depictions for an example method for forming a disclosed semiconductor device shown as 290 in FIG. 2C on a metal substrate 120 including a through-hole aperture having a multi-size cavity that provides a first ring 118 and an additional second ring (or 'pedestal') 119 above the first ring 118. The semiconductor die 180 has a BSM layer 186 that is on the second ring 119, and is directly attached to the metal substrate 120 by a plated metal die attach layer 187. As shown in FIG. 2A the top cavity portion further comprises a second ring 119 that is on an outer edge of the first ring 118.

FIG. 2B shows the in-process semiconductor device after inserting (e.g., picking and placing) the semiconductor die 180 top (active) side up with its BSM layer 186 on the second ring 119, with a portion of the height of the semiconductor die 180 being within the top cavity portion.

FIG. 2C shows the semiconductor device 290 after plating comprising forming a metal die attach layer 187 that directly contacts at the BSM layer 186, the sidewalls of the bottom cavity portion, on the first ring 118 extending out to a sidewall of the second ring 119, and on a bottom side of the metal substrate 120.

Figure 2D:
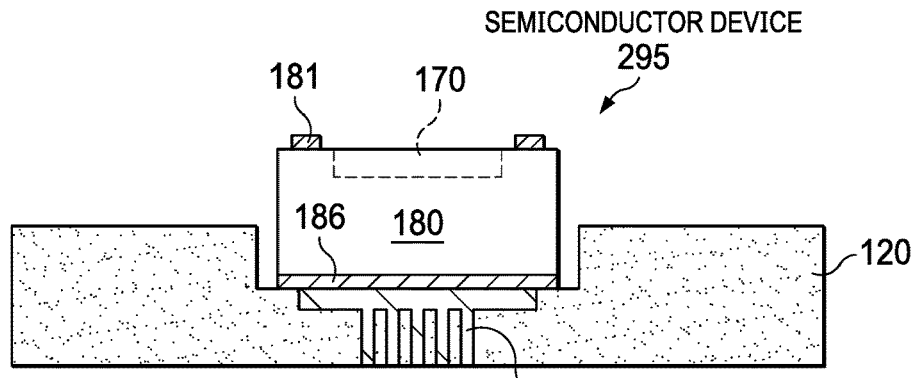
FIG. 2D shows a cross-sectional depiction of a semiconductor device related to the semiconductor device shown FIG. 2C, except now there are multiple smaller cavity 2's in the metal substrate filled with a disclosed metal die attach layer rather than a single larger cavity 2 filled with a disclosed metal die attach layer.

FIG. 2D shows a cross-sectional depiction of a semiconductor device 295 related to the semiconductor device 290 shown FIG. 2C. Now there are multiple smaller cavity 2's in the metal substrate 120 filled with a disclosed metal die attach layer 187 rather than as shown in FIG. 2C a single larger cavity 2 filled with a disclosed metal die attach layer. In addition, the bottom side of the metal substrate 120 is optionally shown lacking the metal die attach layer 187 thereon.

Figure 3:
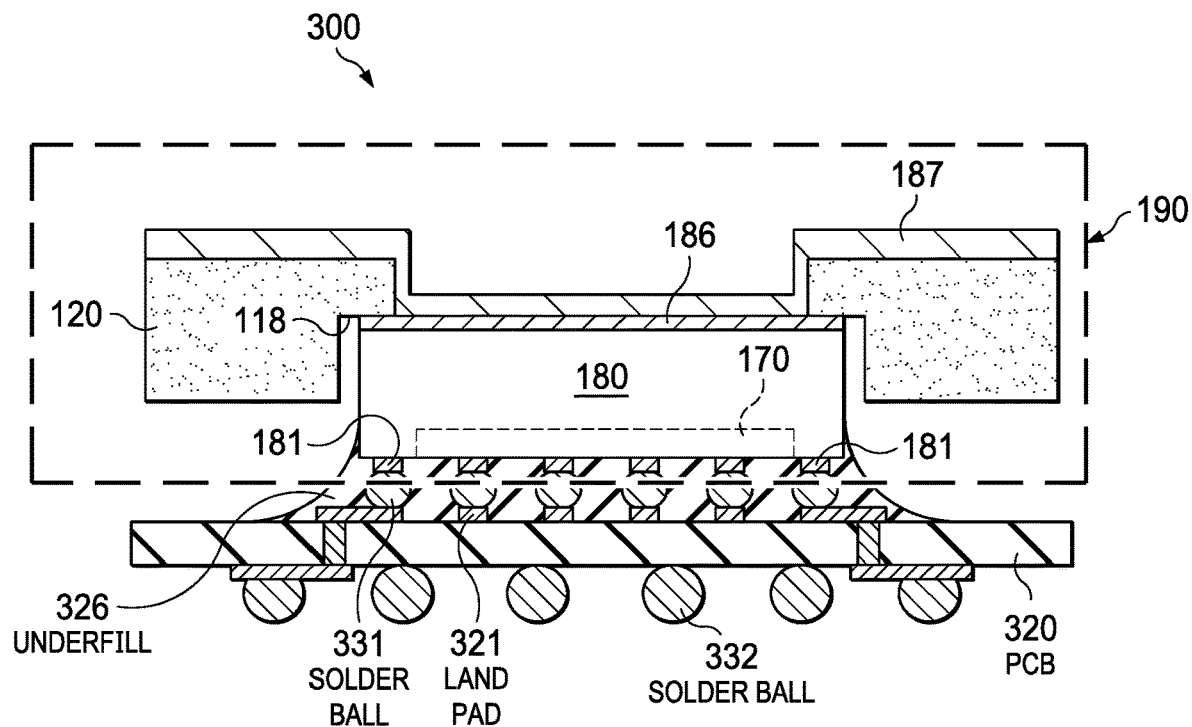
FIG. 3 is a cross sectional depiction of a disclosed semiconductor device on a metal substrate including a through-hole aperture having a multi-size cavity flipchip mounted onto another substrate shown as a PCB.

Subsequent assembly steps for a disclosed semiconductor device can utilize various flows, some with molding and some without molding. FIG. 3 is a cross sectional depiction of a semiconductor assembly 300 comprising the semiconductor device 190 shown in FIG. 1F on a metal substrate 120 including a through-hole aperture having multi-size cavity flipchip mounted onto another substrate shown as a PCB 320. The PCB 320 can be replaced by another IC die. There are solder balls shown as 331 between land pads 321 on the PCB 320 and the bond pads 181 with underfill 326 also shown, and solder balls shown as 332 opposite the land pads 321 on the PCB 320. In this arrangement the metal die attach layer 187 provides a heat spreader.

Figure 4:
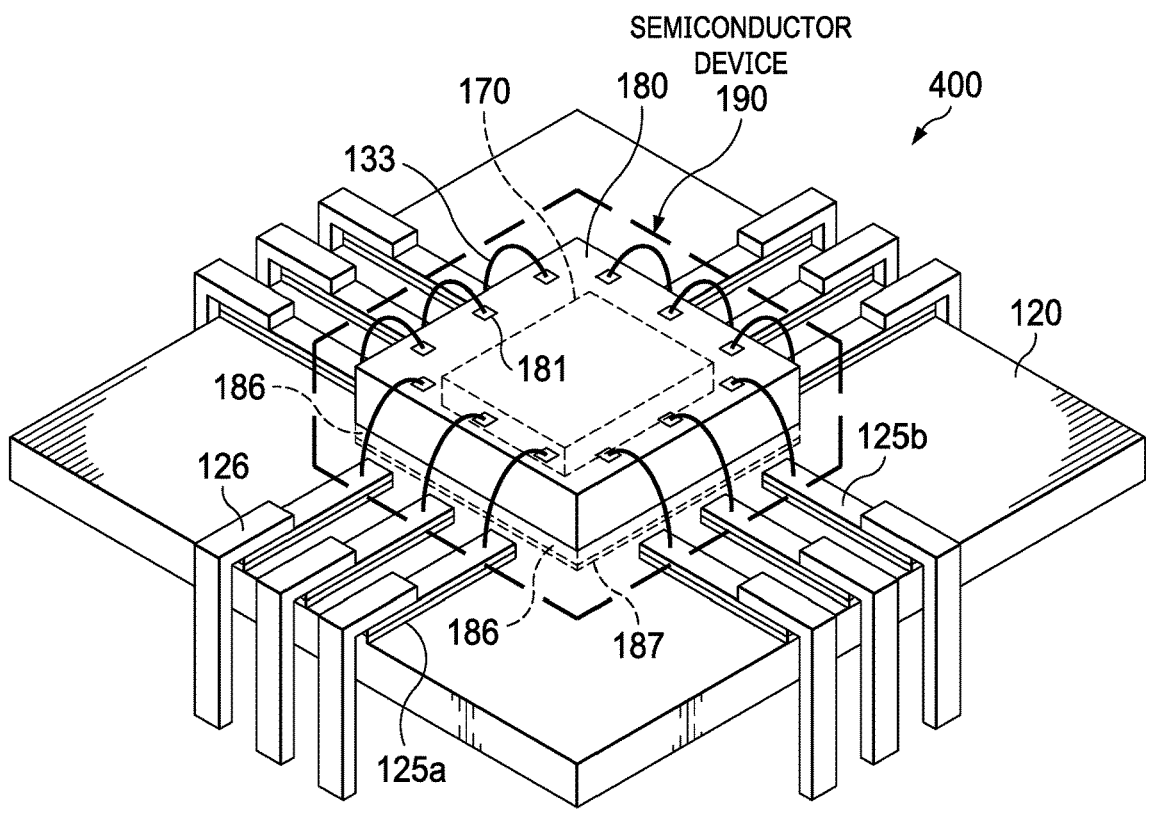
FIG. 4 is a top perspective view of a leaded packaged semiconductor device including disclosed semiconductor device on a metal substrate including a through-hole aperture for receiving the semiconductor die, where bond pads on the semiconductor die are wirebonded to raised metal pads on dielectric pads that are on the metal substrate.

FIG. 4 is a top perspective view of a leaded packaged semiconductor device 400 comprising a disclosed semiconductor device 190 including a semiconductor die 180 on a metal substrate 120 that includes a through-hole aperture for receiving the semiconductor die 180. The semiconductor die 180 is wire bonded to raised metal pads 125b on dielectric pads 125a on the metal substrate 120 to form the leaded packaged semiconductor device 400. There are bondwires 133 between the bond pads 181 and the metal pads 125b. External leads 126 are on the metal pads 125b, such as being soldered on.

Disclosed aspects can be integrated into a variety of assembly flows to form a variety of different packaged semiconductor integrated circuit (IC) devices and related products. The assembly can comprise single semiconductor die, or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A semiconductor device, comprising:
a metal substrate including a through-hole aperture having a multi-size cavity having a larger area top cavity portion above a smaller area bottom cavity portion that defines a first ring around the bottom cavity portion;
a semiconductor die having a top side with bond pads thereon and a back side with a metal (BSM) layer thereon is mounted top side up with the BSM layer on the first ring; and
a metal die attach layer directly contacting at least a portion of the BSM layer, sidewalls of the bottom cavity portion, and a bottom side of the metal substrate.

2. A semiconductor device, comprising:
a metal substrate including a through-hole aperture having a multi-size cavity having a larger area top cavity portion above a smaller area bottom cavity portion that defines a first ring around the bottom cavity portion;
a semiconductor die having a top side with bond pads thereon and a back side with a metal (BSM) layer thereon is mounted top side up with the BSM layer on the first ring; and
a metal die attach layer directly contacting at least a portion of the BSM layer, sidewalls of the bottom cavity portion, and a bottom side of the metal substrate, wherein the BSM layer, the metal substrate, and the metal die attach layer all comprise copper.

3. The semiconductor device of claim 1, wherein the metal die attach layer is an electroplated metal layer.

4. A semiconductor device, comprising:
a metal substrate including a through-hole aperture having a multi-size cavity having a larger area top cavity portion above a smaller area bottom cavity portion that defines a first ring around the bottom cavity portion;
a semiconductor die having a top side with bond pads thereon and a back side with a metal (BSM) layer thereon is mounted top side up with the BSM layer on the first ring; and
a metal die attach layer directly contacting at least a portion of the BSM layer, sidewalls of the bottom cavity portion, and a bottom side of the metal substrate, wherein the metal die attach layer is 40 to 250 μm thick.

5. The semiconductor device of claim 1, wherein the metal die attach layer consists of a single layer.

6. A semiconductor assembly, comprising:
a metal substrate including a through-hole aperture having a multi-size cavity having a larger area top cavity portion above a smaller area bottom cavity portion that defines a first ring around the bottom cavity portion;
a semiconductor die having a top side with bond pads thereon and a back side with a metal (BSM) layer thereon is mounted top side up with the BSM layer on the first ring;
a metal die attach layer directly contacting at least a portion of the BSM layer, sidewalls of the bottom cavity portion, and a bottom side of the metal substrate; and
another substrate coupled to the bond pads.

7. The semiconductor assembly of claim 6, wherein the semiconductor die is flipchip assembled onto the another substrate.

8. The semiconductor assembly of claim 6, wherein the bond pads of the semiconductor die are wire bonded to raised metal pads on dielectric pads on the metal substrate to form a leaded packaged semiconductor device.

9. A semiconductor assembly, comprising:
a semiconductor device assembled on a substrate, the semiconductor device comprising:
a metal substrate including a through-hole aperture having a multi-size cavity having a larger area top cavity portion above a smaller area bottom cavity portion that defines a first ring around the bottom cavity portion;
a semiconductor die having a top side with bond pads thereon and a back side with a metal (BSM) layer thereon is mounted top side up with the BSM layer on the first ring;
a metal die attach layer directly contacting at least a portion of the BSM layer, sidewalls of the bottom cavity portion, and a bottom side of the metal substrate; and
wherein the BSM layer, the metal substrate, and the metal die attach layer all comprise copper.

10. The semiconductor assembly of claim 6, wherein the metal die attach layer is an electroplated metal layer.

11. A method of making a semiconductor device, comprising:
forming a metal substrate including a through-hole aperture having a multi-size cavity having a larger area top cavity portion above a smaller area bottom cavity portion that defines a first ring around the bottom cavity portion;
mounting a semiconductor die having a top side with bond pads thereon and a back side with a metal (BSM) layer thereon top side up with the BSM layer on the first ring; and
directly contacting at least a portion of the BSM layer, sidewalls of the bottom cavity portion, and a bottom side of the metal substrate with a metal die attach layer.

12. A method of making a semiconductor device, comprising:
forming a metal substrate including a through-hole aperture having a multi-size cavity a larger area top cavity portion above a smaller area bottom cavity portion that defines a first ring around the bottom cavity portion, where the top cavity portion is sized with area dimensions to receive a semiconductor die having a top side with bond pads thereon and a back side with a metal (BSM) layer thereon;
mounting a semiconductor die top side up with the BSM layer on the first ring, and
directly contacting at least a portion of the BSM layer, sidewalls of the bottom cavity portion, and a bottom side of the metal substrate with a metal die attach layer, wherein the BSM layer, the metal substrate, and the metal die attach layer all comprise copper.

13. The method of claim 11, wherein the metal die attach layer is an electroplated metal layer.

14. A method of making a semiconductor device, comprising:
forming a metal substrate including a through-hole aperture having a multi-size cavity a larger area top cavity portion above a smaller area bottom cavity portion that defines a first ring around the bottom cavity portion, where the top cavity portion is sized with area dimensions to receive a semiconductor die having a top side with bond pads thereon and a back side with a metal (BSM) layer thereon;
mounting a semiconductor die top side up with the BSM layer on the first ring, and
directly contacting at least a portion of the BSM layer, sidewalls of the bottom cavity portion, and a bottom side of the metal substrate with a metal die attach layer 40 to 250 μm thick.

15. The method of claim 11, wherein the metal die attach layer consists of a single layer.

16. The method of claim 11, further including attaching the semiconductor device to another substrate.

17. The method of claim 16, wherein the bond pads of the semiconductor die are wire bonded to raised metal pads on dielectric pads on the metal substrate to form a leaded packaged semiconductor device.

18. The method of claim 16, wherein the bond pads of the semiconductor device are wire bonded to raised metal pads on dielectric pads on the metal substrate to form a leaded packaged semiconductor device.

19. A method of making a semiconductor device, comprising:
forming a metal substrate including a through-hole aperture having a multi-size cavity a larger area top cavity portion above a smaller area bottom cavity portion that defines a first ring around the bottom cavity portion, where the top cavity portion is sized with area dimensions to receive a semiconductor die having a top side with bond pads thereon and a back side with a metal (BSM) layer thereon;
mounting a semiconductor die top side up with the BSM layer on the first ring, and
directly contacting at least a portion of the BSM layer, sidewalls of the bottom cavity portion, and a bottom side of the metal substrate with a metal die attach layer, wherein the BSM layer, the metal substrate, and the metal die attach layer all comprise copper.

20. The method of claim 16, wherein the metal die attach layer is an electroplated metal layer.

21. A semiconductor device, comprising:
a metal substrate including a through-hole aperture having a multi-size cavity having a larger area top cavity portion, at least one smaller area bottom cavity portion and an intermediate cavity portion between the top and bottom cavity portions, a diameter of the top cavity portion defining a first ring around the intermediate cavity portion;

a semiconductor die having a top side with bond pads thereon and a back side with a metal (BSM) layer thereon is mounted top side up with the BSM layer on the first ring; and a metal die attach layer directly contacting at least a portion of the BSM layer, the intermediate cavity portion, sidewalls of the bottom cavity portion, and a bottom side of the metal substrate.

22. The semiconductor device of claim 21, wherein the metal die attach layer fills the intermediate cavity portion.

23. The semiconductor device of claim 21, wherein at least one smaller area bottom cavity portion includes multiple cavity portions.

24. The semiconductor device of claim 22, wherein the metal die attach layer fills the multiple bottom cavity portions.

* * * * *